(12) United States Patent
Fishman

(10) Patent No.: US 9,056,776 B2
(45) Date of Patent: *Jun. 16, 2015

(54) REMOTE COOL DOWN OF A PURIFIED DIRECTIONALLY SOLIDIFIED MATERIAL FROM AN OPEN BOTTOM COLD CRUCIBLE INDUCTION FURNACE

(71) Applicant: Inductotherm Corp., Rancocas, NJ (US)

(72) Inventor: Oleg S. Fishman, Maple Glen, PA (US)

(73) Assignee: INDUCTOTHERM CORP., Rancocas, NJ (US)

( * ) Notice: Subject to any disclaimer, the term of this patent is extended or adjusted under 35 U.S.C. 154(b) by 2 days.

This patent is subject to a terminal disclaimer.

(21) Appl. No.: 14/058,697

(22) Filed: Oct. 21, 2013

(65) Prior Publication Data

US 2014/0041414 A1 Feb. 13, 2014

Related U.S. Application Data

(62) Division of application No. 12/831,063, filed on Jul. 6, 2010, now Pat. No. 8,562,325.

(60) Provisional application No. 61/222,994, filed on Jul. 3, 2009.

(51) Int. Cl.
| | | |
|---|---|---|
| B29C 39/38 | (2006.01) | |
| B29C 35/06 | (2006.01) | |
| C01B 33/021 | (2006.01) | |
| C30B 28/06 | (2006.01) | |
| C30B 29/06 | (2006.01) | |
| C01B 33/039 | (2006.01) | |
| C01B 33/023 | (2006.01) | |
| C01B 33/02 | (2006.01) | |
| C30B 11/00 | (2006.01) | |
| C30B 28/10 | (2006.01) | |
| C30B 28/08 | (2006.01) | |

(52) U.S. Cl.
CPC ............. *C01B 33/021* (2013.01); *C01B 33/039* (2013.01); *C01B 33/023* (2013.01); *C01B 33/02* (2013.01); *C30B 11/002* (2013.01); *C30B 28/10* (2013.01); *C30B 28/08* (2013.01); *C30B 11/003* (2013.01); *C30B 11/007* (2013.01); *C30B 28/06* (2013.01); *C30B 29/06* (2013.01)

(58) Field of Classification Search
CPC ...... C30B 11/002; C30B 11/003; C30B 28/08
USPC ........ 264/555; 117/30, 31, 32, 54, 73, 81, 82, 117/83, 206; 164/122, 122.1, 122.2, 493
See application file for complete search history.

(56) References Cited

U.S. PATENT DOCUMENTS 8,562,325 B2 * 10/2013 Fishman ................ 425/174.8 R

* cited by examiner

*Primary Examiner* — Dimple Bodawala
*Assistant Examiner* — Robert J Grun
(74) *Attorney, Agent, or Firm* — Philip O. Post

(57) ABSTRACT

Solid or semi-solid feedstock is melted in an open bottom electric induction cold crucible furnace. Directionally solidified multi-crystalline solid purified material continuously exits the bottom of the furnace and may optionally pass through a thermal conditioning chamber before being gravity fed into a transport mold where an ingot of the purified multi-crystalline solid material is transported to a remote holding area after the transport mold is filled with the multi-crystalline material and cut from the continuous supply of material. Cool down of the ingot is accomplished remote from the open bottom of the electric induction cold crucible furnace.

15 Claims, 4 Drawing Sheets

REMOTE COOL DOWN OF A PURIFIED DIRECTIONALLY SOLIDIFIED MATERIAL FROM AN OPEN BOTTOM COLD CRUCIBLE INDUCTION FURNACE

CROSS REFERENCE TO RELATED APPLICATIONS

This is a divisional application of application Ser. No. 12/831,063, filed Jul. 6, 2010, which application claims the benefit of U.S. Provisional Application No. 61/222,994, filed Jul. 3, 2009, both of which applications are hereby incorporated herein by reference in their entireties.

FIELD OF THE INVENTION

The present invention relates to directional solidification of a multi-crystalline ingot of a purified material from an open bottom cold crucible induction furnace where the cool-down of the hot solid ingot is accomplished remote from the furnace.

BACKGROUND OF THE INVENTION

Electromagnetic casting of a multi-crystalline material such as silicon can be accomplished in an open bottom electric induction cold crucible furnace. Feedstock is continuously supplied to the crucible's interior volume and melted in the cold crucible while a solidified hot mass of the multi-crystalline material exits from the open bottom of the crucible. The solidified hot mass of the multi-crystalline material is typically cooled down as an integral step in the casting process after it exits from the electric induction cold crucible without immediate removal from the casting process line.

One object of the present invention is to produce a purified multi-crystalline solid ingot from feedstock material where the feedstock is melted and purified in an open bottom cold crucible induction furnace and a hot multi-crystalline solid mass exits from the bottom of the furnace for deposit in a mold that is removed from the casting process line for remote passive cool-down and directional solidification of the hot multi-crystalline solid mass in the mold without further application of external heating or cooling of the mold.

BRIEF SUMMARY OF THE INVENTION

In one aspect the present invention is apparatus for, and method of, purifying a crystalline material by directional solidification. Solid or semi-solid feedstock is melted in an open bottom cold crucible electric induction furnace. Hot purified multi-crystalline solidified material continuously exits from the open bottom of the furnace, and may optionally pass through a thermal conditioning chamber, before being deposited in a transport mold and moved to a remote holding area for passive cool-down and directional solidification of the hot purified multi-crystalline solidified material.

The above and other aspects of the invention are set forth in this specification and the appended claims.

BRIEF DESCRIPTION OF THE DRAWINGS

The foregoing brief summary, as well as the following detailed description of the invention, is better understood when read in conjunction with the appended drawings. For the purpose of illustrating the invention, there is shown in the drawings exemplary forms of the invention that are presently preferred; however, the invention is not limited to the specific arrangements and instrumentalities disclosed in the following appended drawings.

DETAILED DESCRIPTION OF THE INVENTION

Figure 1:
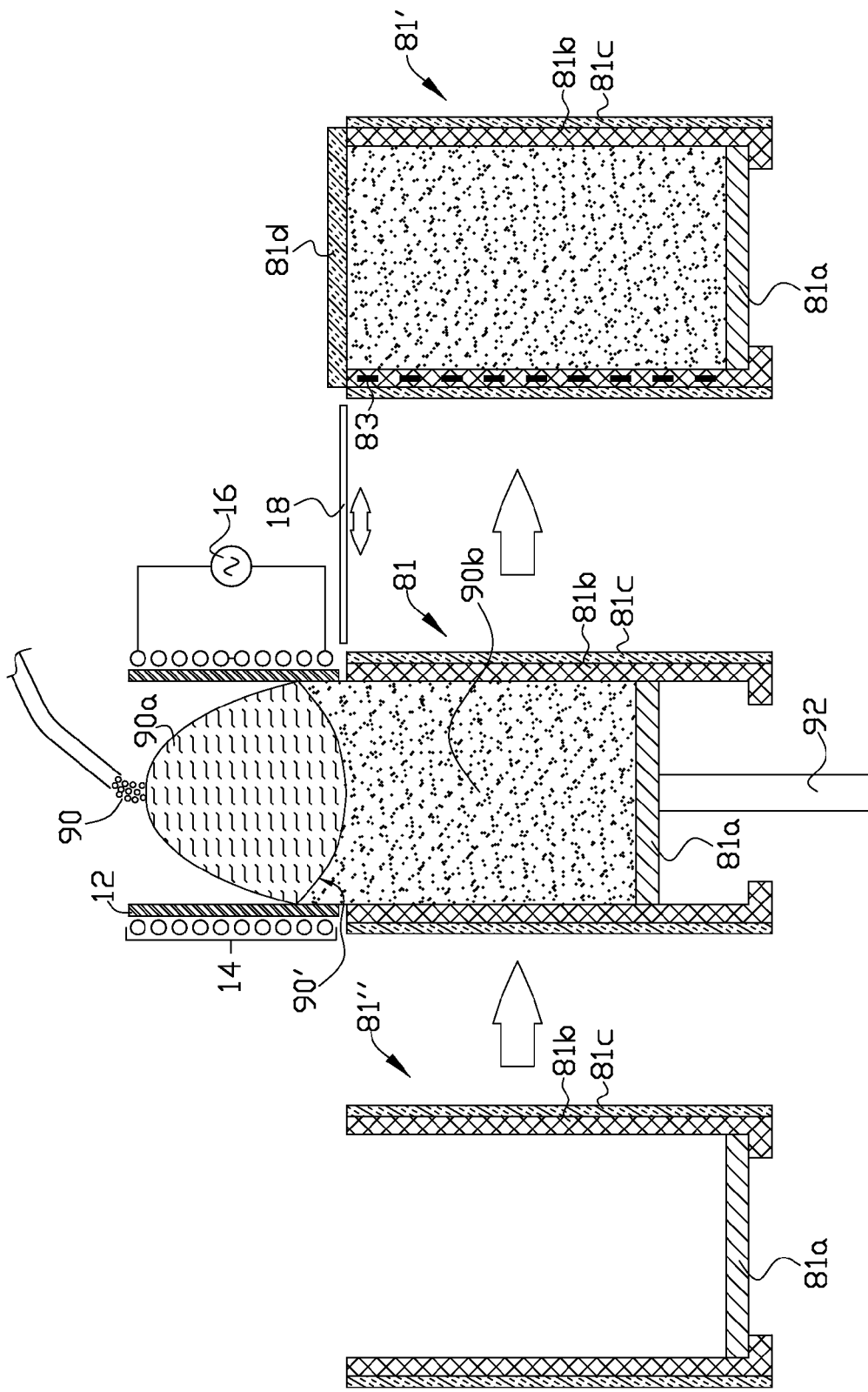
FIG. 1 illustrates on example of an apparatus used in the present invention.

There is shown in FIG. 1 one example of the apparatus and process of the present invention. Feedstock 90 is supplied in a suitable form from a suitable source to electric induction cold crucible 12, which is surrounded by one or more induction coils 14 that are connected to one or more suitable alternating current sources 16. The open bottom electric induction cold crucible 12 is similar in construction and operation to a closed bottom electric induction cold crucible furnace, for example, as described in U.S. Patent Application Publication No. 2005/0175064 A1 except that there is no bottom structure to inhibit bottom exit of a continuous hot solidified mass of a purified multi-crystalline material from the bottom of the cold crucible.

Initially feedstock 90 may be in a semi-solid state (particularly if the feedstock material is non-electrically conductive in the solid state, and electrically conductive in the liquid state, such as silicon feedstock) to establish a generally steady state solidification front 90' of molten feedstock 90a (horizontally line shaded region) over purified multi-crystalline hot solid mass 90b (stipple-shaded region) exiting from the bottom of the cold crucible furnace. The multi-crystalline hot solid mass will gravity free-fall into mold 81. The mold can have a moveable inner bottom 81a with powered driver 92 controlling the drop speed of the moveable inner bottom, and therefore controlling the rate of vertical formation of the multi-crystalline solid mass in the mold. The bottom opening of the induction cold crucible 12 may be of any shape, for example, to produce a cylindrical or rectangular solid mass.

In-process fill mold 81; pre-filled mold 81" and post-filled mold 81' can each be formed from a suitable liner material 81b as consistent with the type of material mass 90b contained within the mold. Thermal insulation 81c may surround at least the exterior wall of the mold. In some examples of the invention, bottom 81a may be formed from a susceptor. The susceptor may optionally be suitably heated, for example either resistively or inductively, prior to filing of the mold.

When the multi-crystalline solid mass has achieved a desired vertical height in mold 81, cut-off saw 18 is activated to slice through a horizontal plane of the multi-crystalline solid mass. Downward movement of the multi-crystalline solid mass can be controlled at a sufficiently slow rate relative to the cut through speed of the cut-off saw so that a substantially horizontal cut of the multi-crystalline solid mass is achieved with the cut-off saw.

Figure 4:
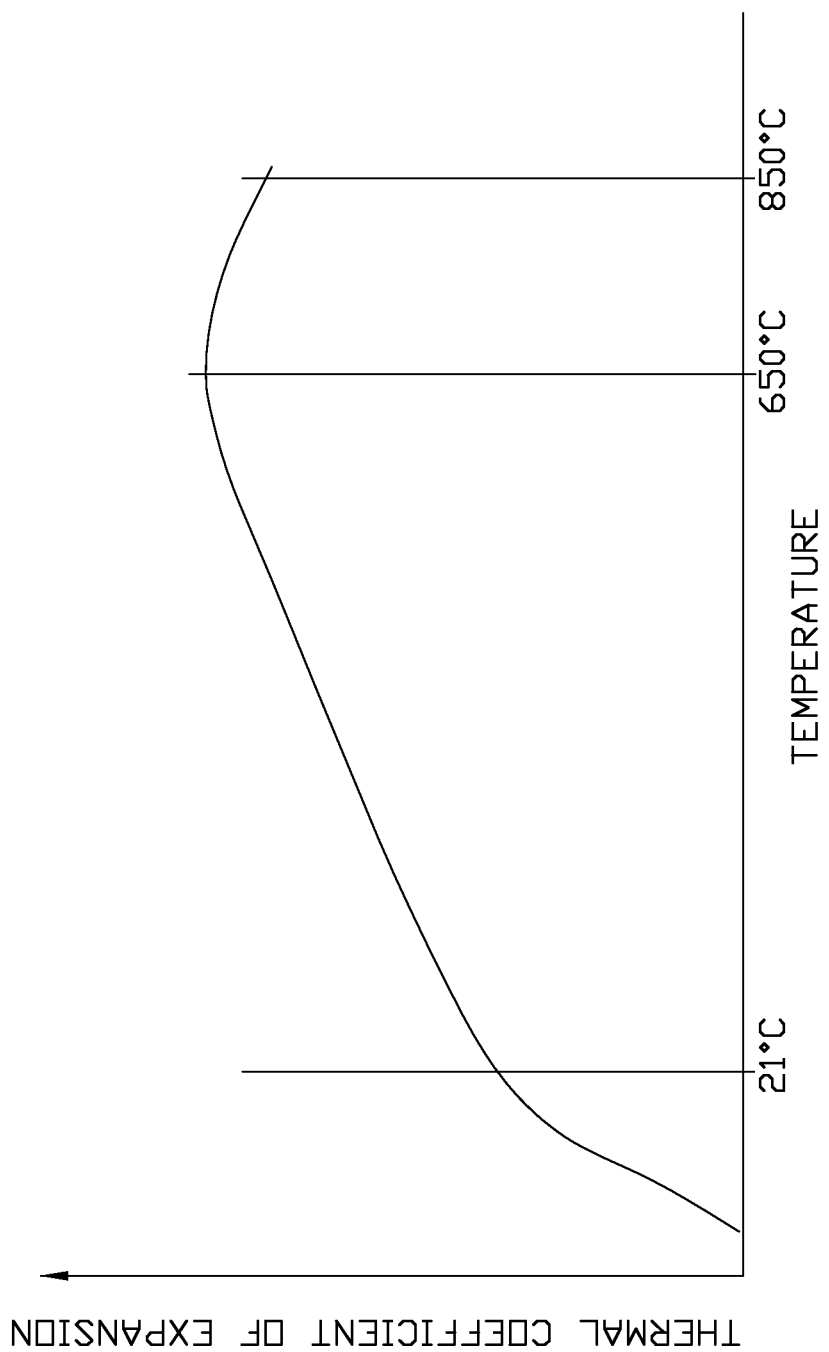
FIG. 4 graphically illustrates the change in thermal coefficient of expansion of solid silicon relative to the temperature of the silicon.

Mold 81, when filled with a hot multi-crystalline solid mass, is moved away from the furnace, as represented by filled mold 81' in FIG. 1 and covered with thermal insulating lid 81d so that the multi-crystalline solid mass in mold 81 cools down and directionally solidifies passively without application of controlled zone external heating or cooling. A multi-crystalline metal or metalloid, such as silicon, will initially solidify (amorphous-to-crystalline phase transition) at a high temperature (nominally 1,380° C. for silicon), which is the hot multi-crystalline solid mass deposited in the mold prior to cool-down and directional solidification. Most important in any material directional solidification process is to avoid an effect know as "shrink defects" caused by volume contraction of the material as it transitions inwardly from the liquid state to the hot solid state by controlling the volume rate of transition from liquid to hot solid state, and then controlling the cool-down (directional solidification) rate of the hot solid mass of material in the mold. For example the graph in FIG. 4 illustrates the expansion and contraction characteristics of solid silicon over a temperature range. Thermal monitoring systems can be provided to monitor the passive rate of cool-down of the hot material mass in the mold, so that, for example, the temperature of the hot solidified mass of purified multi-crystalline material exiting the open bottom of the crucible can be adjusted for an optimum passive cool-down rate. For example thermocouples or other temperature sensors 83 can be buried along the height of the mold's wall to monitor the rate of cool-down in the mold. The entire process may be automated to minimize manpower required for operation of the process as long as a constant material feedstock is available.

The molds can be supplied to the furnace (such as pre-filled mold 81") and removed from the furnace on a suitable conveyance apparatus. The conveyance apparatus can move filled molds to a remote cool-down storage zone that automatically moves molds containing material that have completed the cool-down process to a process finishing zone, for example, for further trimming of the ingot for shipping and recycling of ingot trimmings of sufficient purity as feedstock 90. The entire process may be automated to minimize manpower requirements for the operation.

In some examples of the invention, the filled mold may be inserted into a thermally controlled chamber, or tunnel, at the remote area that further regulates the rate of heat dissipation from the multi-crystalline mass in the mold. The chamber or tunnel can provide passive thermal control, for example, by lining the chamber or tunnel with thermal insulating material.

Generally the mold filing and remote cool-down process is not an extremely fast process. For example for a mold with a cross section of 32 centimeters square, and an interior height of 1 meter, process time to fill the mold with a multi-crystalline solid silicon mass can be on the order of six hours. Completion of a remote passively controlled cool-down of the same mass of silicon in a mold can be on the order of thirty-six hours.

Figure 2:
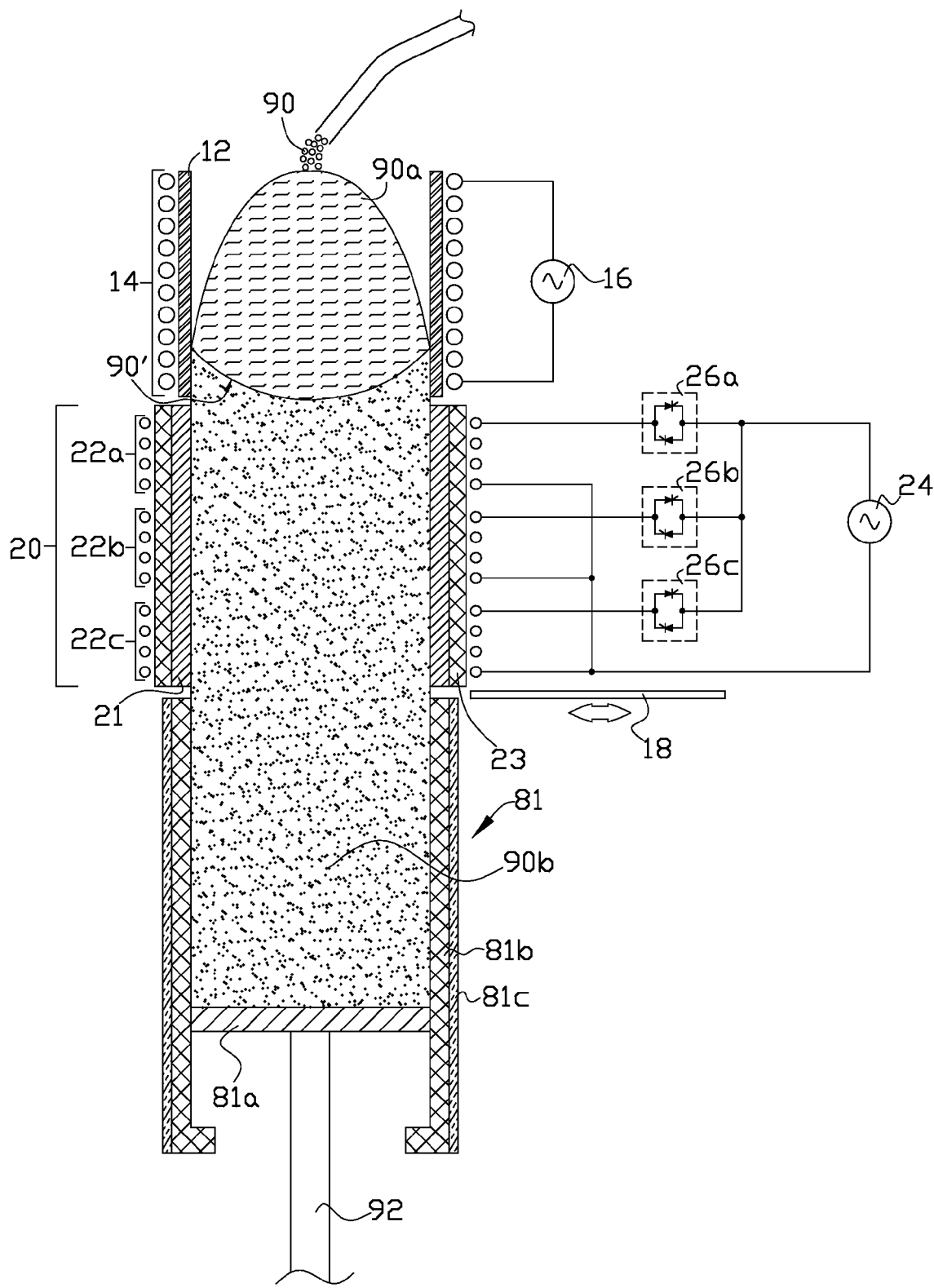
FIG. 2 illustrates another example of an apparatus used in the present invention.

In some examples of the present invention, thermal conditioning of the multi-crystalline solid mass exiting from the cold crucible furnace may be required. This may be achieved, for example, as shown in FIG. 2 wherein graduated vertical heat zone control apparatus 20 is provided. In this example the zone heat source is an induced electromagnetic field selectively applied to vertical zones of susceptor 21 as the multi-crystalline solid mass drops through apparatus 20. The electromagnetic field can be established via current flow through induction coils 22a, 22b and 22c (separated from the susceptor by thermal insulator 23) with current supplied from alternating current source 24 and controlled by switching devices 26a, 26b and 26c. Generally, applied induced heat to the susceptor is reduced in the direction from top to bottom of apparatus 20 to establish a temperature gradient along the height of the susceptor wall. Susceptor 21 performs a secondary function of retaining the outer wall shape of the solidified mass of multi-crystalline material as it passes through apparatus 20.

Figure 3:
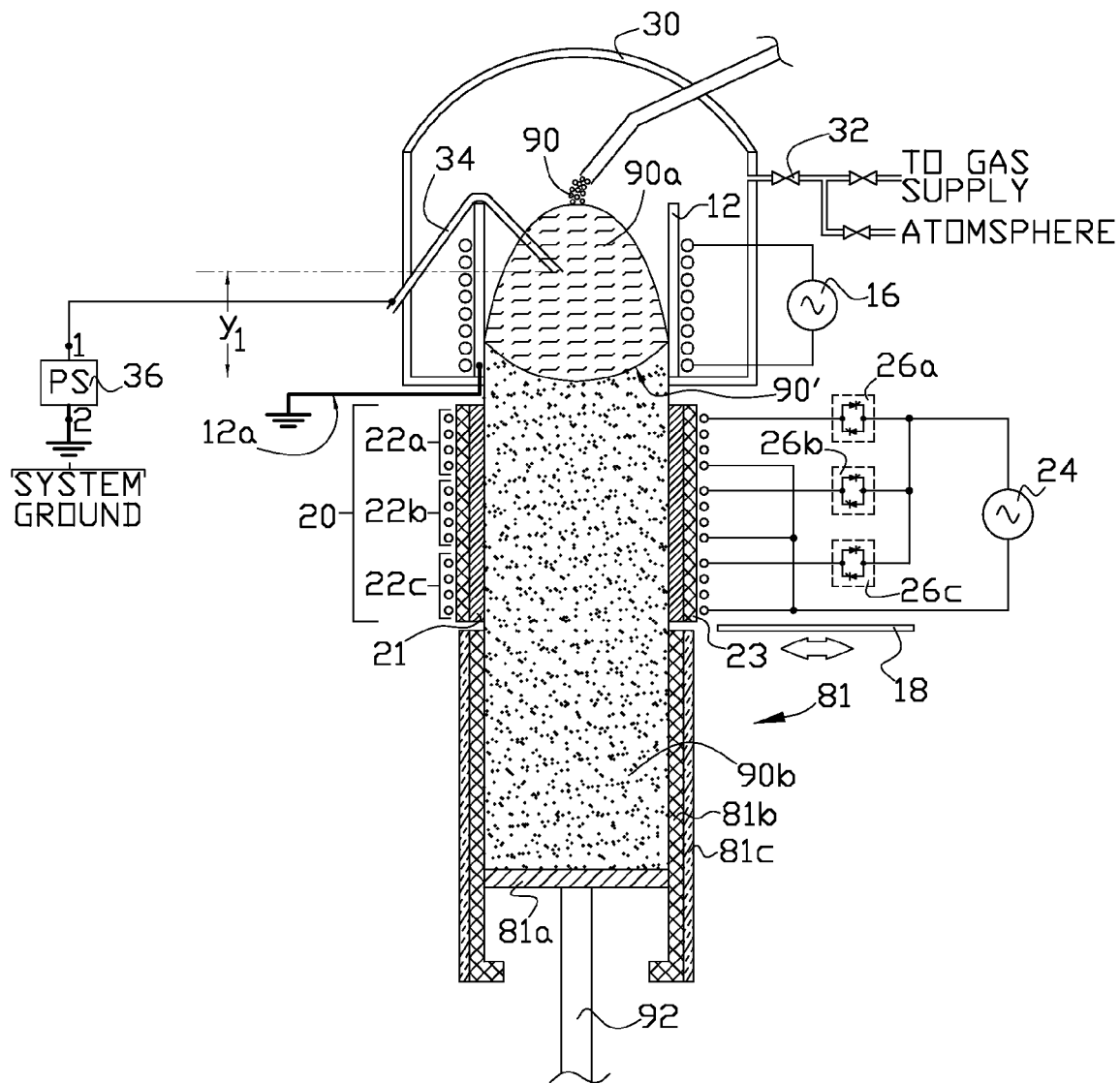
FIG. 3 illustrates another example of an apparatus used in the present invention.

In a directional solidification process, impurities generally migrate to the top of the liquid material phase of the melt. One method of removing these impurities in the present invention is illustrated in FIG. 3. In this example at least the open top of induction cold crucible 12 is contained within sealed pressure chamber 30 so that a positive (above atmospheric) pressure can be applied to the surface of melt 90a below which surfaces the impurities tend to migrate. For example valve 32 may be used to supply an inert gas to the pressure chamber, which forces impurities-enriched melt 90a up tube 34 and out of the pressure chamber. In the particularly arrangement shown in FIG. 3 tube 34 is arranged as a siphon tube. Consequently once the pressurized gas primes siphon tube 34 the interior of chamber 30 can be vented to atmospheric pressure via connecting open valve 32 to atmosphere and the siphon drain of impurities-enriched melt 90a will stop when the height of melt 90a in the cold crucible reaches $y_1$, which is the vertical position of the opening of siphon tube 34 in the uppermost portion of the melt containing the impurities.

Tube 34 may be formed at least in part along its length from a high temperature electrically conductive material. If the tube is formed from an electrically conductive material, the tube may be electrically heated by connecting the external end of the tube to a first terminal of electric power source 36 that has a second terminal connected to system ground. If the cold crucible induction furnace is system grounded, for example by system ground connection 12a to the wall of the crucible, the electrical conducting path through the furnace skull (solid material formed during cold crucible operation) and melt in the crucible that is in contact with the end of the tube in the melt will establish a Joules heating current flow from power source 36 (via the system grounded return) through the electrically conductive tube that will keep the impurities-enriched melt flowing through the tube without solidification (freezing). One must make certain that the system ground is safely installed and operating correctly in any particular installation as established by applicable standards. Impurities-enriched melt drawn from the crucible may be sent to an impurities separator so that sufficiently pure feedstock can be separated from the impurities and fed back into the feedstock supply to the cold crucible.

While the present invention is particularly applicable to a cool-down process for directionally solidified silicon, the invention can also be applied to other metalloids or metals, and alloys thereof, capable of purification by directional solidification that require a controlled cool-down process.

The present invention has been described in terms of preferred examples and embodiments. Equivalents, alternatives and modifications, aside from those expressly stated, are possible and within the scope of the invention.

The invention claimed is:

1. A solidification process for a multi-crystalline material from a melt produced in an open bottom induction cold crucible, the solidification process comprising the steps of:
   supplying a feedstock at the top of the open bottom induction cold crucible;
   forming the melt in the open bottom induction cold crucible by a magnetic flux coupling with the feedstock and melt combination when an alternating current flows through one or more induction coils surrounding the exterior of the open bottom induction cold crucible;
   forming from the melt a continuous supply of a hot solidified mass of a purified multi-crystalline material at the open bottom of the open bottom induction cold crucible;
   gravity feeding the hot solidified mass of the purified multi-crystalline material into a mold having a moveable inner bottom;

controlling the rate of the gravity feeding of the hot solidified mass of the purified multi-crystalline material into the mold by a powered drive in communication with the moveable inner bottom of the mold;

severing the hot solidified mass of the purified multi-crystalline material from the continuous supply of the hot solidified mass of the purified multi-crystalline material at the open bottom of the open bottom induction cold crucible; and moving the mold for remote directional solidification of the hot solidified mass of the purified multi-crystalline material in the mold without application of an external heating or cooling source.

2. The solidification process of claim 1 wherein the step of moving the mold for the remote directional solidification of the hot solidified mass of the purified multi-crystalline material in the mold without application of an external heating or cooling source further comprises inserting the mold into a passive thermally controlled chamber to regulate a rate of heat dissipation from the hot solidified mass of the purified multi-crystalline material in the mold.

3. The solidification process of claim 1 further comprising thermally conditioning the continuous supply of the hot solidified mass of the purified multi-crystalline material at the open bottom of the open bottom induction cold crucible prior to the step of gravity feeding the hot solidified mass of the purified multi-crystalline material into the mold.

4. The solidification process of claim 1 further comprising the step of siphoning impurities in the melt by applying a positive gas pressure to the surface of the melt at the top of the open bottom induction cold crucible to establish a siphon flow from the melt.

5. The solidification process of claim 4 wherein the step of siphoning impurities in the melt further comprises electrically heating a siphon tube having a first end and an opposing second end, the first end submerged in the melt and the second end disposed external to the interior volume of the open bottom induction cold crucible by connecting an electrical ungrounded potential terminal of a power supply to the second end of the siphon tube and an electrical ground potential terminal of the power supply to a system electrical ground, the open bottom induction cold crucible connected to the system electrical ground, whereby an electrical circuit is established across the length of the siphon tube by contact of the first end of the siphon tube with the melt and the melt with a crucible skull formed in the induction cold crucible heating process.

6. The solidification process of claim 1 further comprising the step of thermally insulating at least the exterior walls of the mold.

7. The solidification process of claim 1 further comprising the steps of:
passing the hot solidified mass of purified multi-crystalline material from the open bottom of the open bottom induction cold crucible through a susceptor thermal conditioning vessel prior to gravity feeding the hot solidified mass of the purified multi-crystalline material into the mold; and
thermally conditioning the hot solidified mass of purified multi-crystalline material passing through the susceptor thermal conditioning vessel by generating an alternating current flow through one or more induction coils surrounding the exterior of the susceptor thermal conditioning vessel while the hot solidified mass of purified multi-crystalline material passes through the susceptor thermal conditioning vessel.

8. The solidification process of claim 1 further comprising the steps of:
sealing the top of the open bottom induction cold crucible;
siphoning one or more impurities from the melt through a siphon tube having a first and second ends, the second end opposing the first end, the first end of the siphon tube positioned in the interior volume of the open bottom induction cold crucible, the second end of the siphon tube positioned external to the sealed top of the open bottom induction cold crucible; and
introducing a gas into the sealed top of the open bottom induction cold crucible to raise the level of the melt in the open bottom induction cold crucible by applying a positive gas pressure to the surface of the melt to a height sufficient to establish a siphon flow of the one or more impurities on the surface of the melt from the open bottom induction cold crucible with the siphon flow terminating after the positive gas pressure is removed and the height of the melt drops to the height of the first end of the siphon tube positioned in the interior volume of the open bottom induction cold crucible.

9. The solidification process of claim 8 further comprising:
providing a power supply having an ungrounded electrical output terminal and an electrically grounded electrical output terminal;
connecting the ungrounded electrical output terminal of the power supply to the second opposing end of the siphon tube; and
connecting the electrically grounded electrical output terminal to a system ground connection connected to the open bottom induction crucible so that an electric current flows from the power supply through the siphon tube when the melt makes contact with the siphon tube via a crucible skull formed around the interior wall of the open bottom induction crucible during operation of the open bottom induction cold crucible.

10. A solidification process for a multi-crystalline material from a melt produced in an open bottom induction cold crucible furnace, the solidification process comprising the steps of:
supplying a feedstock through a sealed top of the open bottom induction cold crucible furnace;
forming the melt in the open bottom induction cold crucible furnace by a magnetic flux coupling with the feedstock and melt combination when an alternating current flows through one or more induction coils surrounding the exterior of the open bottom induction cold crucible furnace;
siphoning one or more impurities from the melt through a siphon tube having a first and second ends, the second end opposing the first end, the first end of the siphon tube positioned in the interior volume of the open bottom induction cold crucible furnace, the second end of the siphon tube positioned external to the sealed top of the open bottom induction cold crucible furnace; and
introducing a gas into the sealed top of the open bottom induction cold crucible furnace to raise the level of the melt in the open bottom induction cold crucible furnace by applying a positive gas pressure to the surface of the melt to a height sufficient to establish a siphon flow of the one or more impurities on the surface of the melt from the open bottom induction cold crucible furnace with the siphon flow terminating after the positive gas pressure is removed and the height of the melt drops to the height of the first end of a siphon tube positioned in the interior volume of the open bottom induction cold crucible furnace;

forming from the melt a continuous supply of a hot solidified mass of a purified multi-crystalline material at the open bottom of the open bottom induction cold crucible furnace;

gravity feeding the hot solidified mass of the purified multi-crystalline material into a mold having a moveable inner bottom;

controlling the rate of the gravity feeding of the hot solidified mass of the purified multi-crystalline material into the mold by a powered drive in communication with the moveable inner bottom of the mold;

severing the hot solidified mass of the purified multi-crystalline material from the continuous supply of the hot solidified mass of the purified multi-crystalline material at the open bottom of the open bottom induction cold crucible furnace; and moving the mold for remote directional solidification of the hot solidified mass of the purified multi-crystalline material in the mold without application of an external heating or cooling source.

11. The solidification process of claim 10 wherein the step of moving the mold for the remote directional solidification of the hot solidified mass of the purified multi-crystalline material in the mold without application of an external heating or cooling source further comprises inserting the mold into a passive thermally controlled chamber to regulate a rate of heat dissipation from the hot solidified mass of the purified multi-crystalline material in the mold.

12. The solidification process of claim 10 further comprising thermally conditioning the continuous supply of the hot solidified mass of the purified multi-crystalline material at the open bottom of the open bottom induction cold crucible furnace prior to the step of gravity feeding the hot solidified mass of the purified multi-crystalline material into the mold.

13. The solidification process of claim 10 further comprising the step of thermally insulating at least the exterior walls of the mold.

14. The solidification process of claim 10 further comprising the steps of:

passing the hot solidified mass of purified multi-crystalline material from the open bottom of the open bottom induction cold crucible furnace through a susceptor thermal conditioning vessel prior to gravity feeding the hot solidified mass of the purified multi-crystalline material into the mold; and thermally conditioning the hot solidified mass of purified multi-crystalline material passing through the susceptor thermal conditioning vessel by generating an alternating current flow through one or more induction coils surrounding the exterior of the susceptor thermal conditioning vessel while the hot solidified mass of purified multi-crystalline material passes through the susceptor thermal conditioning vessel.

15. The solidification process of claim 10 further comprising:

providing a power supply having an ungrounded electrical output terminal and an electrically grounded electrical output terminal;

connecting the ungrounded electrical output terminal of the power supply to the second opposing end of the siphon tube; and connecting the electrically grounded electrical output terminal to a system ground connection connected to the open bottom induction crucible furnace so that an electric current flows from the power supply through the siphon tube when the melt makes contact with the siphon tube via a furnace skull formed around the interior wall of the open bottom induction crucible furnace during operation of the open bottom induction cold crucible furnace.

* * * * *